US009412866B2

(12) United States Patent
Kuoh et al.

(10) Patent No.: US 9,412,866 B2
(45) Date of Patent: Aug. 9, 2016

(54) BEOL SELECTIVITY STRESS FILM

(71) Applicant: Taiwan Semiconductor Manufacturing Co., Ltd., Hsin-Chu (TW)

(72) Inventors: Gwo-Chyuan Kuoh, Hsinchu (TW); Chen-Chung Lai, Guanxi Township (TW); Kang-Min Kuo, Zhubei (TW); Bor-Zen Tien, Hsinchu (TW); Yen-Ming Peng, Zhongli (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 16 days.

(21) Appl. No.: 13/924,731

(22) Filed: Jun. 24, 2013

(65) Prior Publication Data

US 2014/0374832 A1    Dec. 25, 2014

(51) Int. Cl.
*H01L 29/78* (2006.01)
*H01L 21/8238* (2006.01)
*H01L 23/00* (2006.01)
*H01L 21/768* (2006.01)

(52) U.S. Cl.
CPC ...... *H01L 29/7843* (2013.01); *H01L 21/76801* (2013.01); *H01L 21/76838* (2013.01); *H01L 21/823871* (2013.01); *H01L 23/00* (2013.01); *H01L 29/7842* (2013.01); *H01L 2924/0002* (2013.01)

(58) Field of Classification Search
CPC .......................... H01L 29/7842; H01L 29/7843
USPC .......................................................... 257/758
See application file for complete search history.

(56) References Cited

U.S. PATENT DOCUMENTS

| 7,132,363 | B2 * | 11/2006 | Yang et al. ..................... 438/639 |
| 7,737,052 | B2 * | 6/2010 | Bhatia et al. .................. 438/787 |
| 8,299,615 | B2 * | 10/2012 | Fayaz et al. ................... 257/758 |
| 2009/0057809 | A1 * | 3/2009 | Richter et al. ................ 257/499 |
| 2010/0190354 | A1 * | 7/2010 | Burnett et al. ................ 438/761 |

* cited by examiner

*Primary Examiner* — Yu-Hsi D Sun
(74) *Attorney, Agent, or Firm* — Eschweiler & Associates, LLC (57) ABSTRACT

The present disclosure relates to an integrated chip having one or more back-end-of-the-line (BEOL) selectivity stress films that apply a stress that improves the performance of semiconductor devices underlying the BEOL selectivity stress films, and an associated method of formation. In some embodiments, the integrated chip has a semiconductor substrate with one or more semiconductor devices having a first device type. A stress transfer element is located within a back-end-of-the-line stack at a position over the one or more semiconductor devices. A selectivity stress film is located over the stress transfer element. The selectivity stress film induces a stress upon the stress transfer element, wherein the stress has a compressive or tensile state depending on the first device type of the one or more semiconductor devices. The stress acts upon the one or more semiconductor devices to improve their performance.

20 Claims, 5 Drawing Sheets

BEOL SELECTIVITY STRESS FILM

BACKGROUND

Modern day integrated chips comprise millions or billions of semiconductor devices that are formed within a semiconductor body (e.g., a silicon wafer). The semiconductor devices are vertically connected to a back-end-of-the-line metallization stack comprising a plurality of overlying metal interconnect wires. The plurality of metal interconnect wires electrically connect the semiconductor devices to each other and to external components.

The plurality of metal interconnect wires increase in size as the distance from the semiconductor devices increases. Often the metal interconnect wires terminate at a bond pad located at a top of the back-end-of-the-line metallization stack. The bond pad may comprise a thick layer of metal that provides a conductive connection from the integrated chip to external components. For example, a metal wire may be configured to contact the bond pad to connect the bond pad to external leads of a package.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

The present disclosure relates to an integrated chip having one or more back-end-of-the-line (BEOL) selectivity stress films configured to apply a stress that improves the performance of semiconductor devices underlying the BEOL selectivity stress films, and an associated method of formation. In some embodiments, the integrated chip comprises a semiconductor substrate comprising one or more semiconductor devices having a first device type. A stress transfer element is located within a back-end-of-the-line stack at a position over the one or more semiconductor devices. A selectivity stress film is located over the stress transfer element. The selectivity stress film is configured to induce a stress upon the stress transfer element, wherein the stress has a state that is a function of the first device type of the one or more semiconductor devices. The stress is transferred from the stress transfer element to the semiconductor substrate, where the stress acts to improve the performance of the one or more semiconductor devices.

Figure 1A:
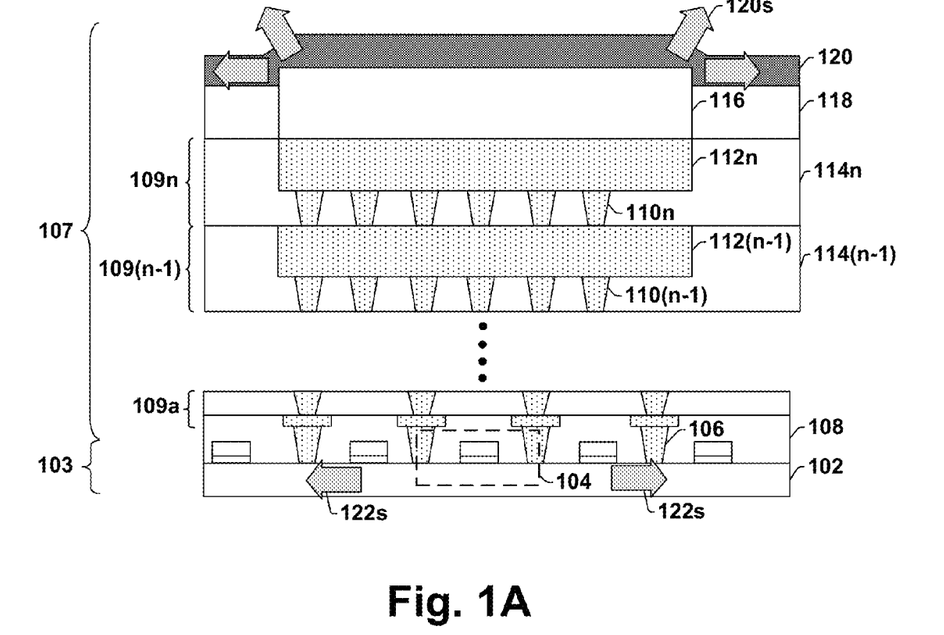
FIGS. 1A-1B illustrates some embodiments of a cross-sectional view of an integrated chip comprising a back-end-of-the-line selectivity stress film.

FIG. 1A illustrates a block diagram of some embodiments of an integrated chip 100 comprising a back-end-of-the-line selectivity stress film 120 configured to induce stress on one or more underlying semiconductor devices 104.

Figure 1B:
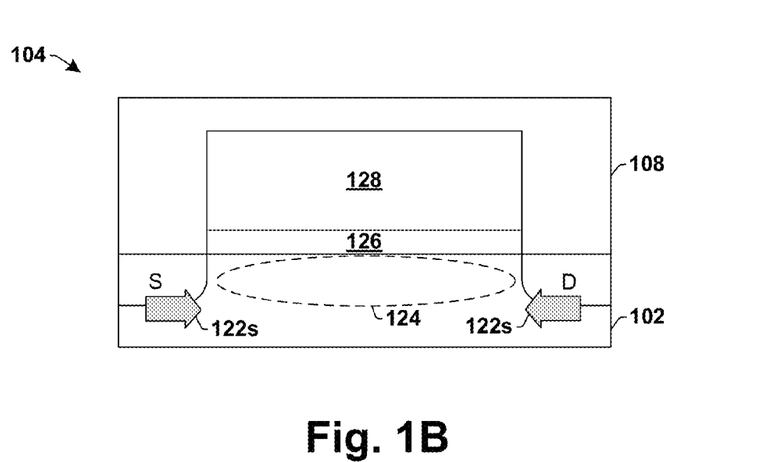

The integrated chip 100 comprises a semiconductor substrate 102 (e.g., a silicon substrate, a silicon germanium substrate, etc.). One or more semiconductor devices 104 having a first type (e.g., NMOS, PMOS) are disposed within a front-end-of-the-line (FEOL) 103 of the integrated chip 100. In some embodiments, shown in FIG. 1B, the one or more semiconductor devices 104 may comprise MOSFET (metal-oxide-silicon field effect transistor) devices having a source region and a drain region separated by a channel 124. A gate region, overlying the channel and configured to control the flow of charge carriers between the source and drain regions, comprises a gate material 128 (e.g., aluminum, polysilicon, etc.) disposed above a gate insulation layer 126. The gate region may comprise a single finger gate (as shown) or a multiple finger gate, in various embodiments.

Metal contacts 106 are disposed within a dielectric layer 108 disposed onto the semiconductor substrate 102. The metal contacts 106 are configured to connect the semiconductor devices 104 to a back-end-of-the-line (BEOL) stack 107 comprising a plurality of metal interconnect layers 109a, ..., 109n. Respective metal interconnect layers 109 may comprise metal contacts 110 and metal interconnect wires 112 disposed within a dielectric material 114. The plurality of metal interconnect layers 109a, ..., 109n are configured to provide signals to and/or from the one or more semiconductor devices 104.

A stress transfer element 116 is disposed within a dielectric material 118 in the BEOL stack 107 at a position vertically overlying the one or more semiconductor devices 104. In some embodiments, the stress transfer element 116 may comprise a wire bond pad and/or a redistribution layer configured to perform a routing function (i.e., to route signals to different locations on the integrated chip 100). In other embodiments, the stress transfer element 116 may comprise other structures, such as a dielectric film, for example. Although the stress transfer element 116 is illustrated as having a top surface that protrudes from the dielectric material 118 it will be appreciated that the stress transfer element 116 may alternatively have a top surface aligned with a top surface of the dielectric material 118.

A selectivity stress film 120 is disposed over the stress transfer element 116. The selectivity stress film 120 is configured to apply a stress 120s on the stress transfer element 116. The stress 120s has a value and/or state (e.g., a tensile or compressive state) that is a function of the first type of the one or more semiconductor devices 104. For example, if the one or more semiconductor devices 104 comprise NMOS devices, the selectivity stress film may generate a stress having a first state (e.g., a tensile stress), while if the one or more semiconductor devices 104 comprise PMOS devices the selectivity stress film may generate a stress having a second state (e.g., a compressive stress).

The stress 120s is transferred from the stress transfer element 116, through the back-end-of-the-line stack 107, to the semiconductor substrate 102, where the stress 120s generates a channel stress 122s that improves performance of the one or more semiconductor devices 104. For example, the stress 120s generated by the selectivity stress film 120 may act (e.g., push, pull) upon the stress transfer element 116, which in turn acts upon underlying layers in the BEOL metallization stack 107 to induce a channel stress 122s on the one or more semiconductor devices 104.

In some embodiments, the selectivity stress film 120 may comprise a dielectric material configured to provide a compressive or tensile stress state depending upon a type (e.g., an n-channel 'NMOS' MOSFET or a p-channel 'PMOS' MOSFET) of the underlying semiconductor devices 104. For example, the selectivity stress film 120 may comprise a nitride layer comprising nitrogen, an oxide layer comprising oxygen, or an oxynitride layer comprising oxygen and nitrogen. In some embodiments, the selectivity stress film 120 may further comprise a dopant, such as boride, which is introduced into the selectivity stress film 120 during formation.

By inducing channel stress 122s on the one or more semiconductor devices 104, device performance of the one or more semiconductor devices 104 is improved. For example, the induced channel stress 122s can increase the saturation current of the one or more semiconductor devices 104. In some embodiments, wherein the stress transfer element 116 is located at a position vertically overlying a plurality of semiconductor devices, the channel stress 122s may improve device performance of the plurality of devices underlying the semiconductor devices.

Figure 2:
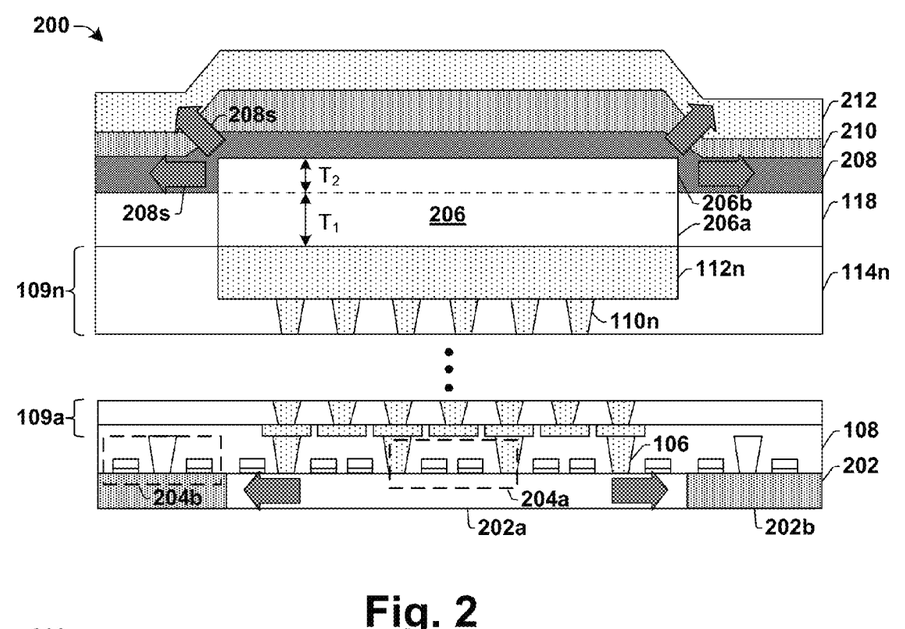
FIG. 2 illustrates some embodiments of a cross-sectional view of an integrated chip having multiple selectivity stress films configured to induce stress on a protruding stress transfer element.

FIG. 2 illustrates some embodiments of a cross-sectional view of an integrated chip 200 having multiple selectivity stress films 208-212 configured to induce stress on a protruding stress transfer element 206.

The integrated chip 200 comprises a semiconductor substrate 202 having a first device type region 202a and a second device type region 202b. The first device type region 202a comprises one or more semiconductor devices 204a having of a first type (e.g., NMOS transistor devices or PMOS transistor devices) and the second device type region 202b comprises one or more semiconductor devices 204b having of a second type (e.g., PMOS transistor devices or NMOS transistor devices). In some embodiments, the first device type region 202a comprises a region of the semiconductor substrate 202 having a first doping type (e.g., a p-type doping), while the second device type region 202b comprises a region of the semiconductor substrate 202 having a second doping type (e.g., an n-type doping) different than the first doping type.

For example, the first device type region 202a may comprise a p-doped semiconductor substrate having one or more n-channel 'NMOS' transistor devices comprising n-well source and drain regions formed within the p-doped semiconductor substrate. The second device type region 202b may comprise an n-doped well region within a semiconductor substrate. The n-doped well region may comprise one or more p-channel 'PMOS' transistor devices having source and drain regions comprising p-wells formed within the n-doped well.

The one or more semiconductor devices 204 are connected to a back-end-of-the-line (BEOL) metallization stack comprising a plurality of metal interconnect layers 109a, . . . , 109n. The one or more metal interconnect layers 109a, . . . , 109n are connected to a protruding stress transfer element 206 that extends outward as a positive relief from a surrounding dielectric material.

The protruding stress transfer element 206 comprises a first portion 206a disposed within the surrounding dielectric material 118, and a second portion 206b that protrudes from the surrounding dielectric material 118. The protrusion of the protruding stress transfer element 206 from the dielectric material 118 increases the stress on the protruding stress transfer element 206 provided by overlying selectivity stress films 208-212. In some embodiments, the first portion 206a of the protruding stress transfer element 206 has a height $T_1$ and the second portion 206b of the protruding stress transfer element 206 has a height T2, wherein the ratio of the heights $(T_2/T_1)$ is in a range of between approximately 0.01 and approximately 3.

A first selectivity stress film 208 is disposed onto the protruding stress transfer element 206. The first selectivity stress film 208 is configured to generate a first stress. A second selectivity stress film 210 is disposed onto the first selectivity stress film 208. The second selectivity stress film 210 is configured to generate a second stress. A third selectivity stress film 212 is disposed onto the second selectivity stress film 210. The third selectivity stress film 212 is configured to generate a third stress. The first, second, and third stresses collectively act upon the stress transfer element 206.

In some embodiments, the first, second and third stresses comprise different stress values. For example, the first stress may comprise a compressive stress of −100 MPa, the second stress may comprise a compressive stress of −150 MPa, and the third stress may comprise a compressive stress of −50 MPa, to generate a collective compressive stress on the stress transfer element 206 of approximately −300 MPa. In various embodiments, the stress generated by the first selectivity stress film 208, the second selectivity stress film 210, or the third selectivity stress film 212, may vary between a tensile stress of approximately 500 MPa (megapascals) and a compressive stress of approximately −700 MPa.

Although integrated chip 200 is illustrated as having three stacked selectivity stress films 208-212, it will be appreciated that the disclosed integrated chip 200 may additional selectivity stress films configured to generate additional stresses on the stress transfer element 206. For example, in some embodiments, a disclosed integrated chip 200 may comprise four or five stacked selectivity stress films configured to generate additional stresses on the stress transfer element 206.

Figure 3:
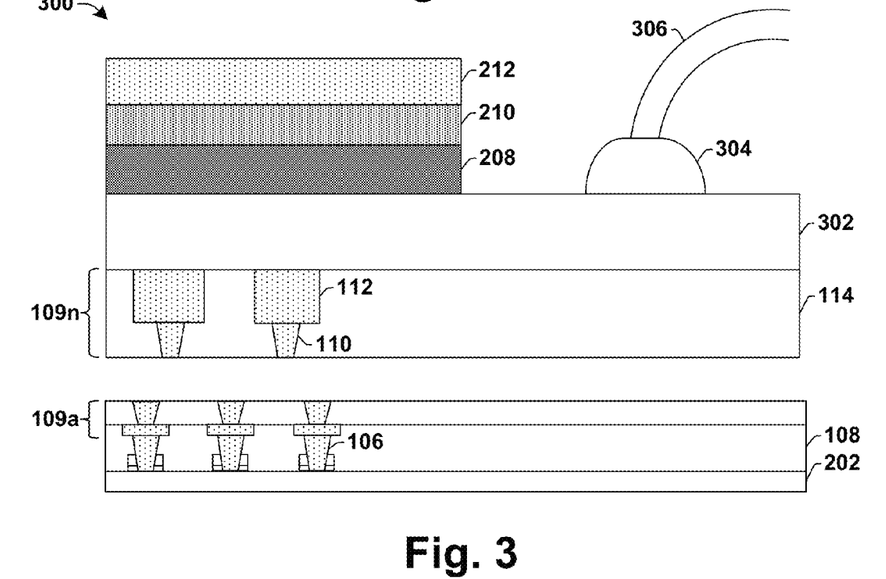
FIG. 3 illustrates some embodiments of an alternative cross-sectional view of an integrated chip having multiple selectivity stress films configured to induce stress on a wire bond pad/redistribution layer.

FIG. 3 illustrates some embodiments of an alternative cross sectional view of an integrated chip 300 having multiple selectivity stress films 208-212 configured to induce stress on a stress transfer element comprising a wire bond pad/redistribution layer 302.

The integrated chip 300 comprises one or more semiconductor devices 204 disposed within a semiconductor substrate 202 and connected to a back-end-of-the-line metallization stack comprising a plurality of metal interconnect layers 109a, . . . , 109n. The one or more metal interconnect layers 109a, . . . , 109n are configured to terminate at a stress transfer element comprising a wire bond pad/redistribution layer 302.

The wire bond pad/redistribution layer 302 is configured to provide for an electrical connection between the semiconductor devices 204 and external leads. The selectivity stress films 208-212 are located above the wire bond pad/redistribution layer 302. The selectivity stress films 208-212 are configured to leave an exposed surface of the wire bond pad/redistribution layer 302, to which a bonding wire 306 is connected by way of a solder ball 304. In various embodiments, the wire bond pad/redistribution layer 302 may comprise aluminum, copper, or a combination thereof. In some embodiments, the wire bond pad/redistribution layer 302 may be further configured to perform routing between the plurality of metal interconnect layers 109a, . . . , 109n.

Figure 4A:
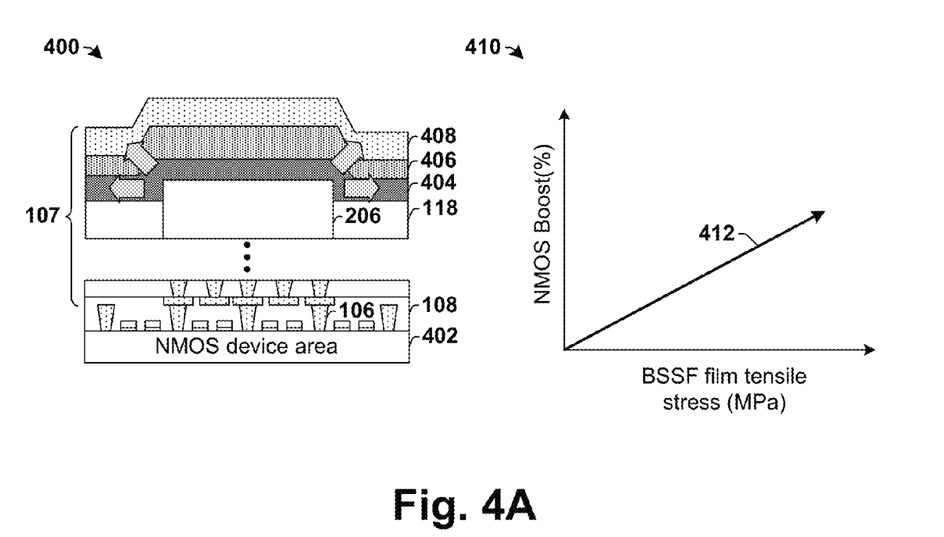
FIGS. 4A-4B illustrate cross-sectional views of integrated chips having one or more selectivity stress films configured to improve NMOS and PMOS device performance.
Figure 4B:
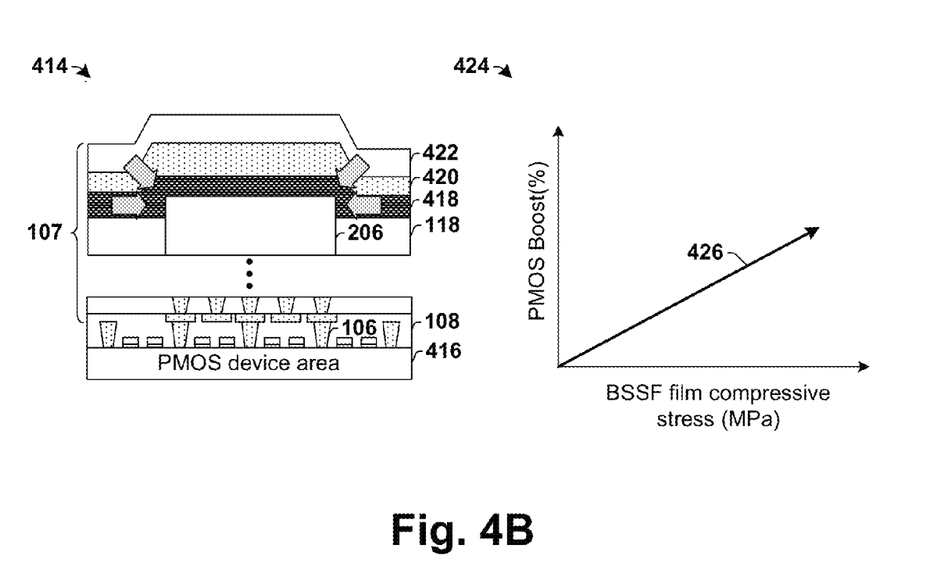

FIGS. 4A-4B illustrate cross-sectional views of integrated chips having one or more selectivity stress films configured to improve NMOS and PMOS device performance.

FIG. 4A illustrates an integrated chip 400 having a plurality of selectivity stress films 404-408 located over an NMOS region 402 of a semiconductor substrate having one or more NMOS transistor devices. The selectivity stress films 404-408 are configured to generate a tensile stress on a protruding stress transfer element 206. The tensile stress pulls outward on the stress transfer element 206, causing the stress transfer element 206 to pull upward on the underlying back-end-of-the-line (BEOL) stack 107, thereby propagating the stress through the BEOL stack 107 to the semiconductor substrate 102. The upward force of the stress causes a tensile stress on the channel of the one or more NMOS transistor devices underlying the protruding stress transfer element 206.

Graph 410 shows the improvement in saturation current of an NMOS transistor device as a function of the tensile stress induced by the selectivity stress films 404-408. As illustrated by trend line 412, as the tensile stress induced by the selectivity stress films 404-408 increases, the improvement in the saturation current of the NMOS transistor devices underlying the stress transfer element 206 will improve.

FIG. 4B illustrates an integrated chip 414 having a plurality of selectivity stress films 418-422 located over a PMOS region 416 of a semiconductor substrate having one or more PMOS transistor devices. The selectivity stress films 418-422 are configured to generate a compressive stress on a protruding stress transfer element 206. The compressive stress pushes inward on the stress transfer element 206, causing the stress transfer element to push downward on the underlying back-end-of-the-line (BEOL) stack 107, thereby propagating the stress through the BEOL stack 107 to the semiconductor substrate 102. The downward force of the stress causes a compressive stress on the channel of the one or more PMOS transistor devices underlying the protruding stress transfer element 206.

Graph 424 shows the improvement in saturation current of a PMOS transistor device as a function of the compressive stress induced by the selectivity stress films 418-422. As illustrated by trend line 426, as the compressive stress induced by the selectivity stress films 418-422 increases, the improvement in the saturation current of the PMOS transistor devices underlying the stress transfer element 206 improves.

Figure 5A:
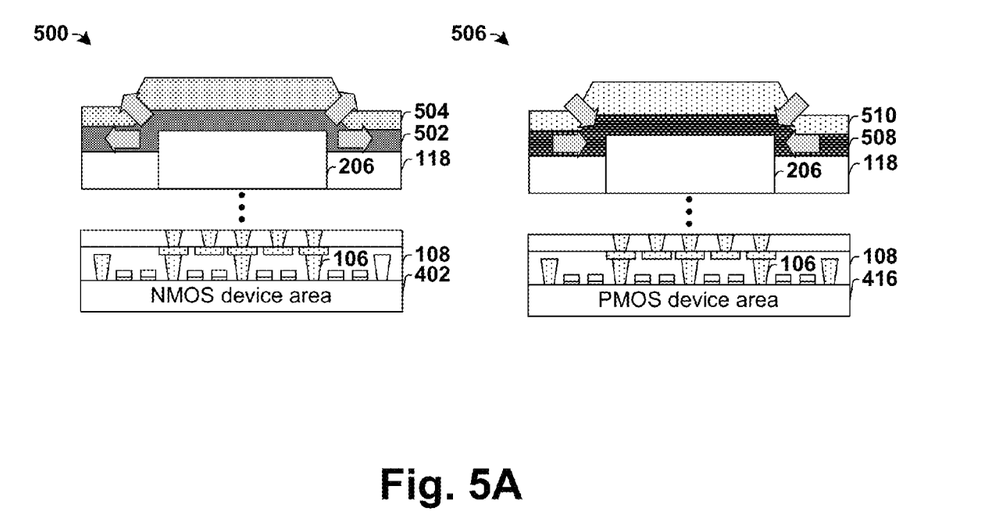
FIG. 5A illustrates some embodiments of cross-sectional views of integrated chips comprising selectivity stress films global disposed onto an underlying substrate.

FIG. 5A illustrates some embodiments of cross-sectional views of integrated chips comprising global selectivity stress films globally disposed onto underlying semiconductor substrates.

Integrated chip 500 illustrates a stress transfer element 206 overlying a NMOS region 402 of a semiconductor substrate having one or more NMOS transistor devices. Global selectivity stress films 502-504 are disposed over the stress transfer element 206 to cover the semiconductor substrate in areas except those left exposed for wire bonding. For example, the global selectivity stress films 502-504 may be disposed along an interior area of integrated chip 500 while leaving exposed surfaces of wire bond pads along a perimeter of the integrated chip 500. Integrated chip 506 illustrates global selectivity stress films 508-510 disposed over a stress transfer element 206 overlying a PMOS region 416 of a semiconductor substrate having one or more PMOS transistor devices.

Figure 5B:
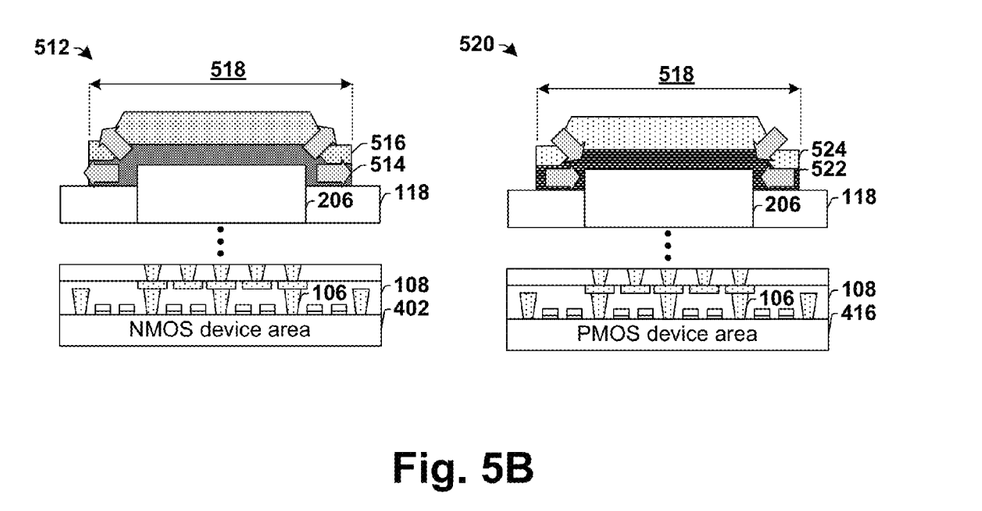
FIG. 5B illustrates some embodiments of cross-sectional views of integrated chips comprising selectivity stress films locally disposed onto an underlying substrate.

FIG. 5B illustrates some embodiments of cross-sectional views of integrated chips comprising local selectivity stress films locally disposed onto an underlying substrate.

Integrated chip 512 illustrates a stress transfer element 206 overlying a NMOS region 402 of a semiconductor substrate having one or more NMOS transistor devices. Local selectivity stress films 514-516 are disposed over the stress transfer element 206 to cover the semiconductor substrate an area that is located within a vicinity of the stress transfer element 206. For example, the local selectivity stress films 514-516 may be disposed over an area 518 extending between 1 nm and 50 microns beyond the stress transfer element 206. Integrated chip 520 illustrates local selectivity stress films 522-524 disposed over a stress transfer element 206 overlying a PMOS region 416 of a semiconductor substrate having one or more PMOS transistor devices.

Figure 6:
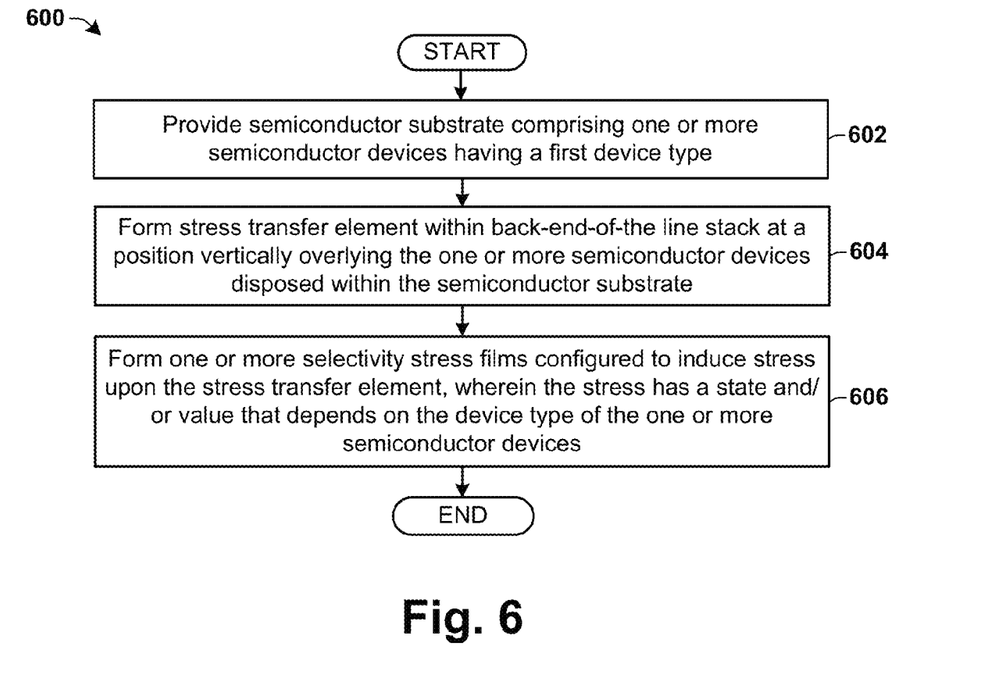
FIG. 6 illustrates a flow chart of some embodiments of a method of forming a back-end-of-the-line selectivity stress film to improve semiconductor device performance.

FIG. 6 illustrates a flow chart of some embodiments of a method 600 of forming a back-end-of-the-line selectivity stress film configured to improve semiconductor device performance.

While the disclosed method 600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 602, a semiconductor substrate is provided having one or more semiconductor devices having a first device type. In some embodiments, the first device type may comprise p-channel 'PMOS' devices, while in other embodiments, the first device type may comprise n-channel 'NMOS' devices.

At 604, a stress transfer element is formed within back-end-of-the line stack at a position vertically overlying the one or more semiconductor devices disposed within the semiconductor substrate. The stress transfer element may be formed within a dielectric material (e.g., silicon dioxide) overlying one or more metal interconnect layers. In some embodiments, the stressed element may be formed by depositing a metal (e.g., aluminum, copper, etc.) into a cavity in the dielectric material using a vapor deposition process (e.g., PVD, CVD, PECVD, etc.).

In some embodiments, the stress transfer element may comprise a wire bond pad and/or a redistribution layer. In other embodiments, the stress transfer element may comprise other structures, such as a dielectric film, for example.

At 606, one or more selectivity stress films configured to induce stress upon the stress transfer element are formed. The induced stress has a value and/or state (e.g., a tensile or compressive state) that depends upon the device type of the one or more semiconductor devices underlying the stress transfer element. For example, if the one or more semiconductor devices underlying the stress transfer element comprise n-channel (NMOS) transistor devices the selectivity stress film is configured to apply a tensile stress. Alternatively, if the one or more semiconductor devices underlying the stress transfer element comprise p-channel (PMOS) transistor devices the selectivity stress film is configured to apply a compressive stress.

In various embodiments, the selectivity stress film may be formed by a vapor deposition process (e.g., PVD, CVD, PECVD, etc.). The stress provided by the selectivity stress film may be adjusted by varying one or more process parameters of a deposition to achieve stress values between approximately 500 MPa of tensile stress and approximately −700 MPa of compressive stress. In some embodiments, the stress provided by the selectivity stress film may be varied by varying a temperature used during deposition of the selectivity stress film. For example, depositing a selectivity stress film at a first temperature will result in a selectivity stress film having a first stress value while depositing a selectivity stress film at a second temperature will result in a selectivity stress film having a second stress value different than the first stress value. In other embodiments, the stress provided by the selectivity stress film may be varied by varying a power using during a deposition, a gas flow rate, a gas flow combination (e.g., an amount of boride into a processing chamber), etc.

In some embodiments, the selectivity stress film may comprise a dielectric material. For example, the selectivity stress film may comprise a nitride layer comprising nitrogen, an oxide layer comprising oxygen, or an oxynitride layer comprising oxygen and nitrogen. In some embodiments, the selectivity stress film may further comprise a dopant, such as boride, which is introduced into the selectivity stress film during formation.

Act 606 may be iteratively performed to form one or more stacked selectivity stress films. For example, in some embodiments, a first selectivity stress film may be formed over the stress transfer element, a second selectivity stress film may be formed over the first selectivity stress film, etc.

By adding one or more stress compensation layers to a position above a stressed element within the back-end-of-the-line, stress is reduced on semiconductor devices, thereby improving performance of the semiconductor devices.

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to an integrated chip having one or more back-end-of-the-line (BEOL) selectivity stress films configured to apply a stress that improves the performance of semiconductor devices underlying the BEOL selectivity stress films, and an associated method of formation In some embodiments, the present disclosure relates to an integrated chip. The integrated chip comprises a semiconductor substrate comprising one or more semiconductor devices having a first device type. The integrated chip further comprises a stress transfer element located within a back-end-of-the-line stack at a position over the one or more semiconductor devices. The integrated chip further comprises a selectivity stress film located over the stress transfer element and configured to induce a stress upon the stress transfer element, wherein the stress has a compressive state or a tensile state depending on the first device type of the one or more semiconductor devices.

In other embodiments, the present disclosure relates to an integrated chip. The integrated chip comprises a semiconductor substrate comprising one or more semiconductor devices having a first device type. The integrated chip further comprises a stress transfer element located within a back-end-of-the-line stack at a position overlying the one or more semiconductor devices. The integrated chip further comprises a selectivity stress film disposed over the stress transfer element and configured to apply a stress to the stress transfer element that has a value that is a function of the first device type of the one or more semiconductor devices. Upon receiving the stress, the stress transfer element is configured to induce a channel stress on the semiconductor substrate at a location within channel regions of the one or more semiconductor devices.

In other embodiments, the present disclosure relates to a method of forming a back-end-of-the-line stress compensation layer to improve semiconductor device performance. The method comprises providing a semiconductor substrate having one or more semiconductor devices having a first device type. The method further comprises forming a stress transfer element within a back-end-of-the line stack at a position overlying one or more semiconductor devices. The method further comprises forming a selectivity stress film configured to induce a stress upon the stress transfer element, wherein the stress has a compressive state or a tensile state depending on the first device type of the one or more semiconductor devices.

What is claimed is:

1. An integrated chip, comprising:
   a semiconductor substrate comprising one or more semiconductor devices having a first device type;
   a stress transfer element located within a back-end-of-the-line stack at a position over the one or more semiconductor devices and over one or more metal interconnect wires overlying the one more semiconductor devices, wherein the stress transfer element protrudes outward from a surrounding dielectric material; and
   a selectivity stress film contacting an upper surface and sidewalls of the stress transfer element and configured to induce a stress upon the stress transfer element, wherein the stress transfer element is configured to transfer the stress to channel regions of the one or more semiconductor devices.

2. The integrated chip of claim 1, wherein the one or more semiconductor devices having the first device type comprise one or more NMOS transistor devices or one or more PMOS transistor devices.

3. The integrated chip of claim 2, wherein the selectivity stress film is configured to apply a tensile stress on the stress transfer element overlying the one or more NMOS transistor devices.

4. The integrated chip of claim 1, wherein the stress transfer element comprises a first portion, having a first height, which is embedded within the surrounding dielectric material surrounding the stress transfer element, and a second portion, having a second height, which protrudes from the dielectric material.

5. The integrated chip of claim 4, wherein the selectivity stress film laterally abuts the second portion and vertically abuts a top surface of the surrounding dielectric material.

6. The integrated chip of claim 1, wherein the selectivity stress film comprises nitrogen, oxygen, or a combination thereof.

7. The integrated chip of claim 1, further comprising:
one or more additional selectivity stress films disposed above the selectivity stress film and configured to induce compressive stresses upon the stress transfer element, wherein the stress transfer element transfers the compressive stresses to channel regions PMOS transistor devices directly underlying the one or more additional selectivity stress films.

8. The integrated chip of claim 1, wherein the stress transfer element comprises a dielectric film vertically disposed between the selectivity stress film and the metal interconnect wires.

9. The integrated chip of claim 1, wherein the stress transfer element has a planar bottom surface that contacts a planar top surface of an underlying metal wire layer and that has a width that is greater than or equal to a width of an upper surface of the underlying metal wire layer.

10. The integrated chip of claim 1, wherein the stress transfer element continuously extends in a lateral direction over a plurality of transistor devices.

11. The integrated chip of claim 1, wherein the stress transfer element contacts an underlying metal wire layer and has sidewalls that are aligned with sidewalls of the underlying metal wire layer.

12. The integrated chip of claim 1, wherein the selectivity stress film comprises a protrusion overlying the stress transfer element and having angled sidewalls vertically overlying sidewalls of the stress transfer element.

13. A method of forming a back-end-of-the-line stress compensation layer to improve semiconductor device performance, comprising:
providing a semiconductor substrate having one or more semiconductor devices having a first device type;
forming a stress transfer element within a back-end-of-the line stack at a position overlying the one or more semiconductor devices and over one or more metal interconnect wires overlying the one more semiconductor devices, wherein the stress transfer element protrudes outward from a surrounding dielectric material;
forming a selectivity stress film contacting the stress transfer element and configured to induce a stress upon the stress transfer element, wherein the stress has a compressive state or a tensile state depending on the first device type of the one or more semiconductor devices, and wherein the selectivity stress film comprises a protrusion overlying the stress transfer element and having angled sidewalls vertically overlying sidewalls of the stress transfer element; and
wherein the stress transfer element is configured to transfer the stress to channel regions of the one or more semiconductor devices.

14. The method of claim 13, wherein the selectivity stress film is configured to apply a tensile stress on the stress transfer element overlying one or more NMOS transistor devices.

15. The method of claim 13, wherein the selectivity stress film comprises nitrogen, oxygen, or a combination thereof.

16. The method of claim 13, wherein the selectivity stress film is configured to generate a stress having a value of between approximately 500 megapascals (MPa) of tensile stress and approximately −700 MPa of compressive stress.

17. An integrated chip, comprising:
a substrate comprising a semiconductor device;
a stress transfer element located over the semiconductor device;
one or more metal interconnect wires vertically arranged between the semiconductor device and the stress transfer element;
a selectivity stress film contacting a sidewall of the stress transfer element and configured to induce a stress upon the stress transfer element that has a tensile state or a compressive state depending on a type of the semiconductor device, wherein the stress is transferred to a channel region of the semiconductor device via the stress transfer element and one or more metal interconnect wires to increase a substrate stress within the channel region;
an inter-level dielectric (ILD) layer laterally contacting the sidewall of the stress transfer element and vertically contacting a lower surface of the selectivity stress film; and
wherein the selectivity stress film contacts the sidewall of the stress transfer element along a first interface that is aligned with a second interface along which the ILD layer contacts the sidewall of the stress transfer element.

18. The integrated chip of claim 17, wherein the stress transfer element protrudes outward from the ILD layer surrounding the stress transfer element.

19. The integrated chip of claim 17, wherein the stress transfer element protrudes outward from the ILD layer comprising an oxide.

20. The integrated chip of claim 17, further comprising:
a conductive contact arranged between the one or more metal interconnect wires and a gate electrode of the semiconductor device.

* * * * *